United States Patent [19]

Koike

[11] Patent Number: 4,613,773
[45] Date of Patent: Sep. 23, 1986

[54] RACEFREE CMOS CLOCKED LOGIC CIRCUIT

[75] Inventor: Hideharu Koike, Yokohama, Japan

[73] Assignee: Tokyo Shibaura Denki Kabushiki Kaisha, Kawasaki, Japan

[21] Appl. No.: 572,756

[22] Filed: Jan. 23, 1984

[30] Foreign Application Priority Data

Jan. 29, 1983 [JP] Japan .................................. 58-13506

[51] Int. Cl.⁴ .................... H03K 19/096; H03K 23/44; H03K 3/037; G11C 19/28
[52] U.S. Cl. ................................. 307/443; 307/481; 307/279; 377/79; 377/105; 377/117
[58] Field of Search ............... 307/443, 452, 453, 481, 307/579, 583, 279; 377/78–80, 104–106

[56] References Cited

U.S. PATENT DOCUMENTS

| | | | |
|---|---|---|---|
| 3,766,408 | 10/1973 | Suzuki et al. | 377/105 |
| 3,887,822 | 6/1975 | Suzuki | 307/481 X |
| 3,925,685 | 12/1975 | Suzuki | 307/481 |
| 3,937,982 | 2/1976 | Nakajima | 307/481 X |
| 4,040,015 | 8/1977 | Fukuda | 340/173 |
| 4,063,114 | 12/1977 | Morozumi | 377/106 |
| 4,114,049 | 9/1978 | Suzuki | 307/481 X |
| 4,164,666 | 8/1979 | Hirasawa | 307/443 X |
| 4,369,379 | 1/1983 | Hull | 307/481 X |

FOREIGN PATENT DOCUMENTS 2544434 4/1977 Fed. Rep. of Germany .

OTHER PUBLICATIONS

Suzuki et al., "Clocked CMOS Calculator Circuitry," IEEE International Solid-State Circuits Conference, ISSCC, pp. 58–59, Wednesday, Feb. 14, 1973.
Goncalves et al., "A Racefree-Dynamic CMOS Technique for Pipelined Logic Structures," ESSCIRC Dig. Tech, Papers, pp. 141–144, 1982.

Primary Examiner—Larry N. Anagnos
Attorney, Agent, or Firm—Finnegan, Henderson, Farabow, Garrett & Dunner

[57] ABSTRACT

A racefree CMOS clocked logic circuit includes a first CMOS clocked gate for selectively transferring an input signal according to a first clock pulse and providing an interstage signal corresponding to the input signal; and a second CMOS clocked gate, which is connected directly to the first CMOS clocked gate, for selectively transferring the interstage signal according to a second clock pulse and providing an output signal corresponding to the interstage signal. The operation of first CMOS clocked gate is synchronized to the first clock pulse, and the operation of second CMOS clocked gate is synchronized to the second clock pulse. The second clock pulse is in-phase with or identical to the first clock pulse so that signal races between the input signal and the output signal are eliminated.

6 Claims, 14 Drawing Figures

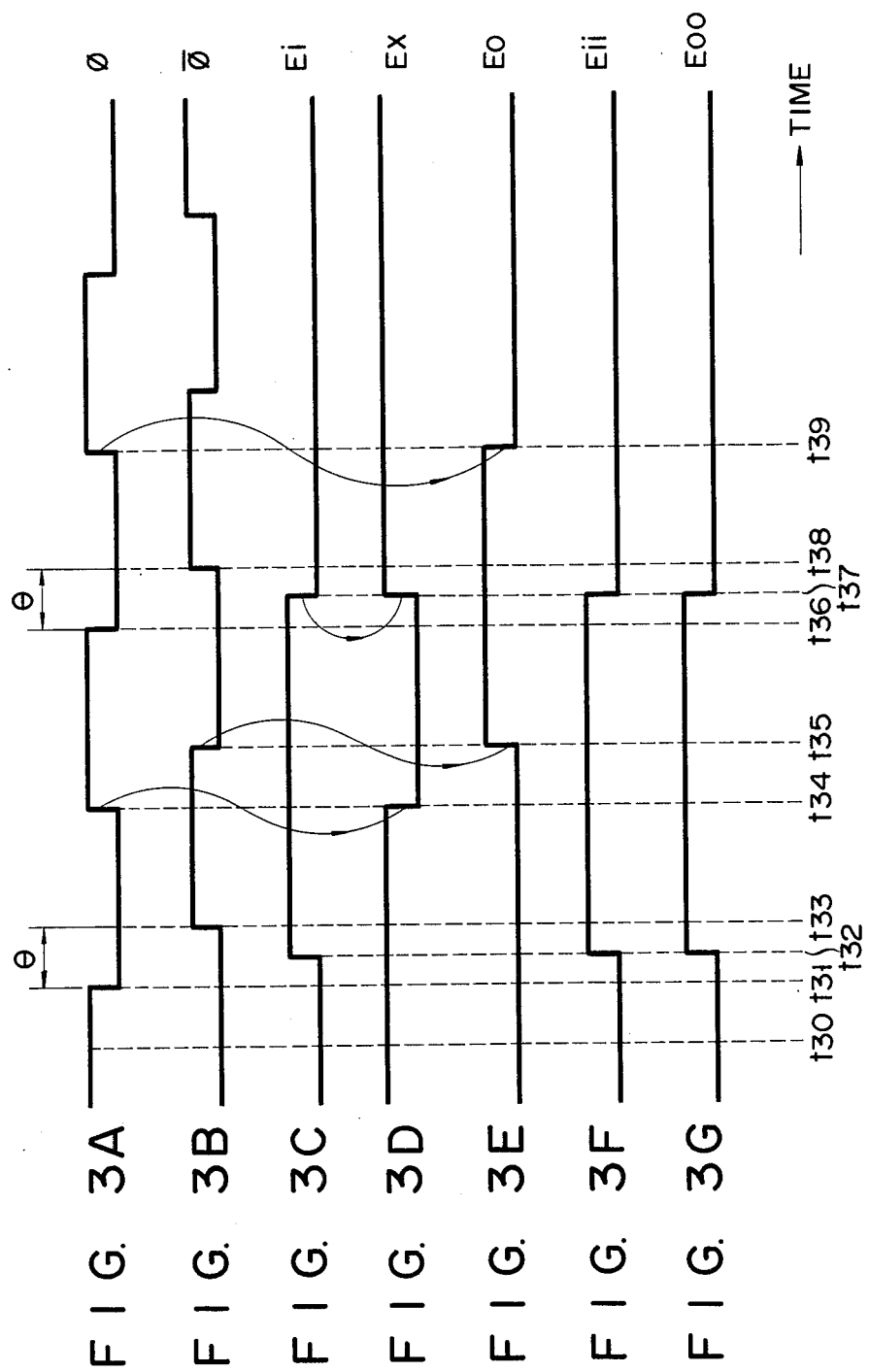

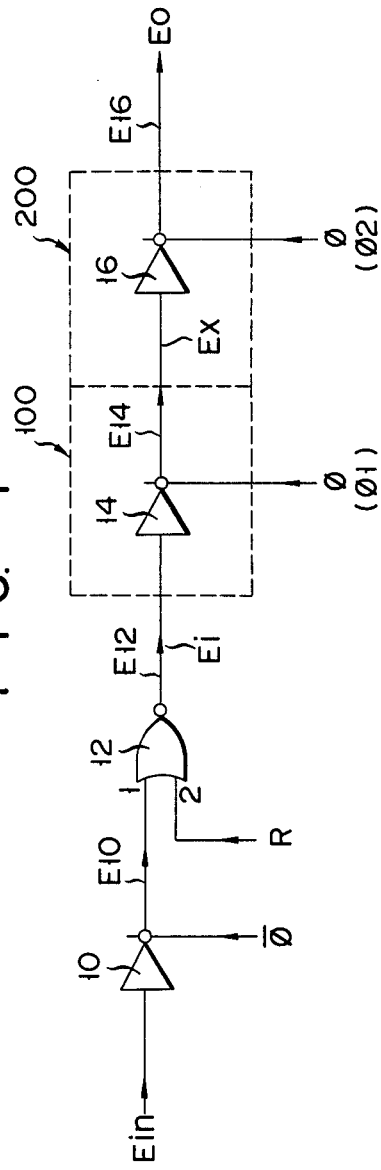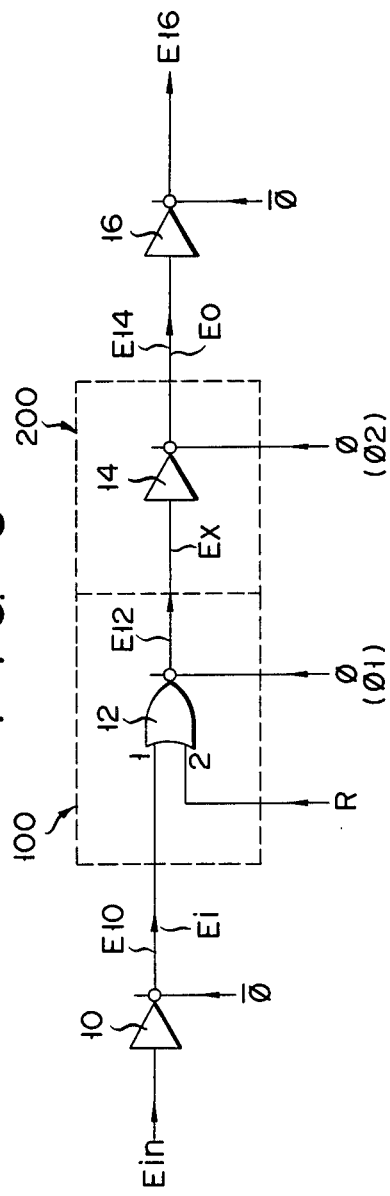

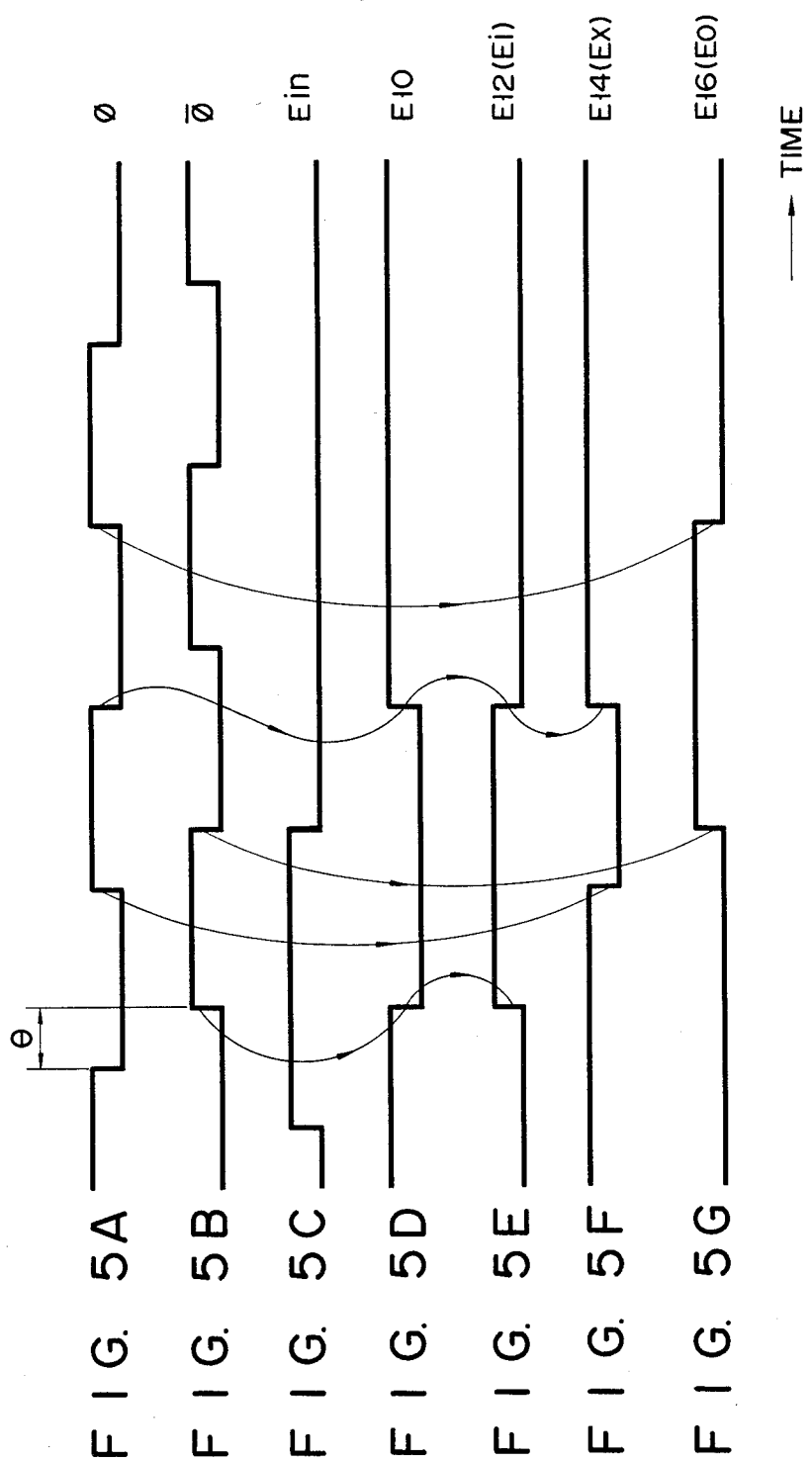

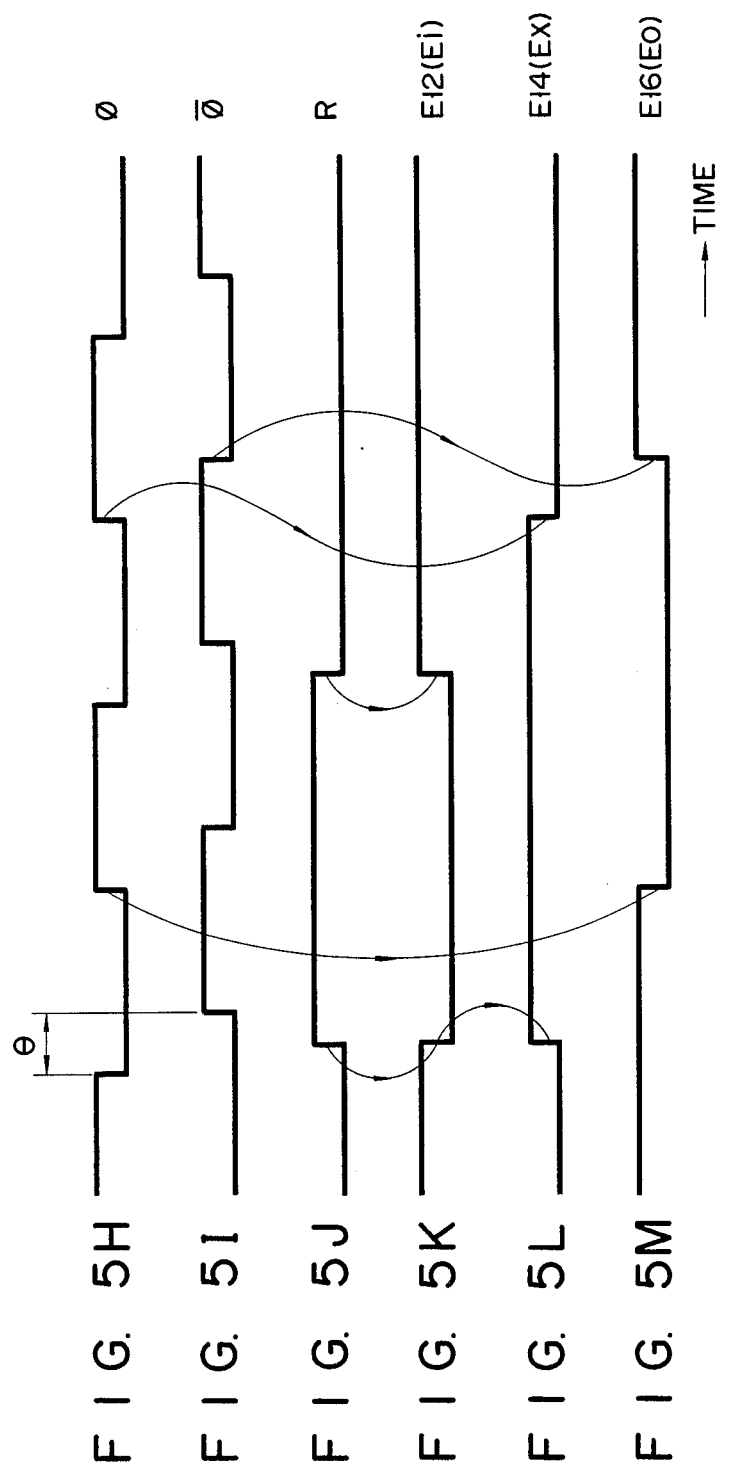

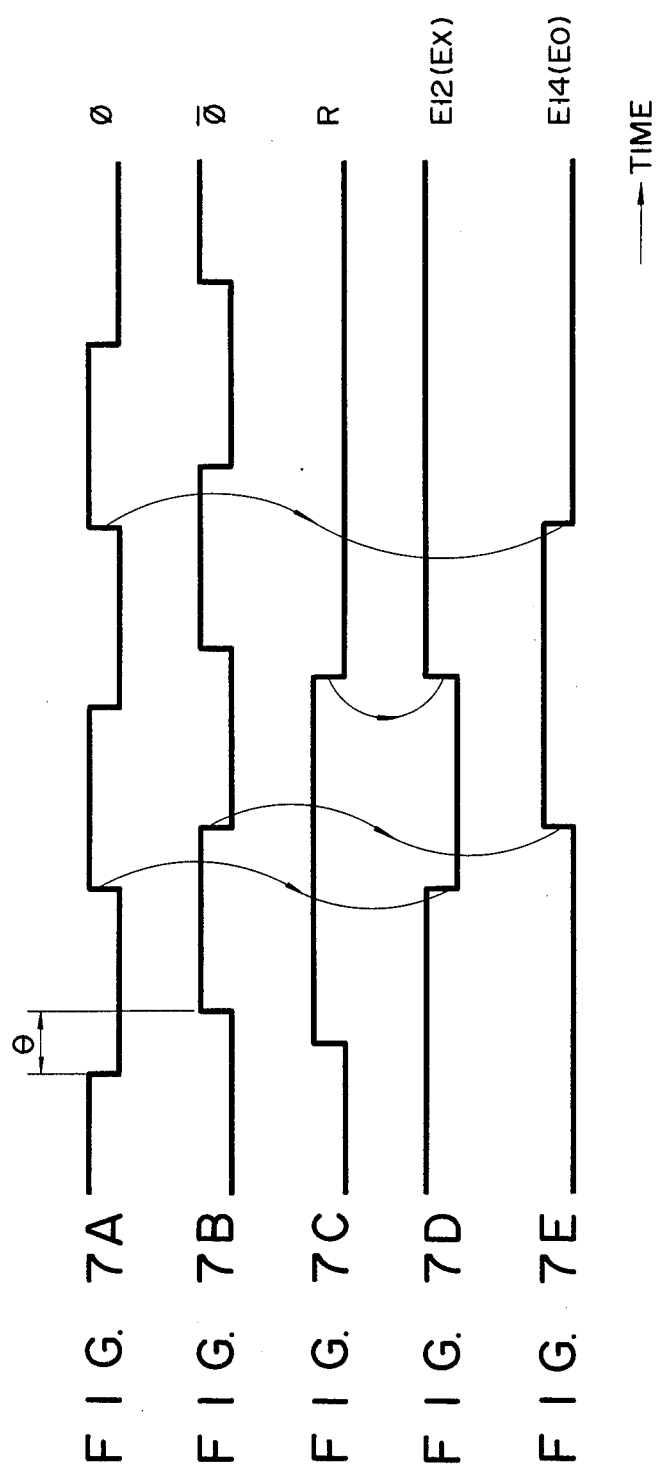

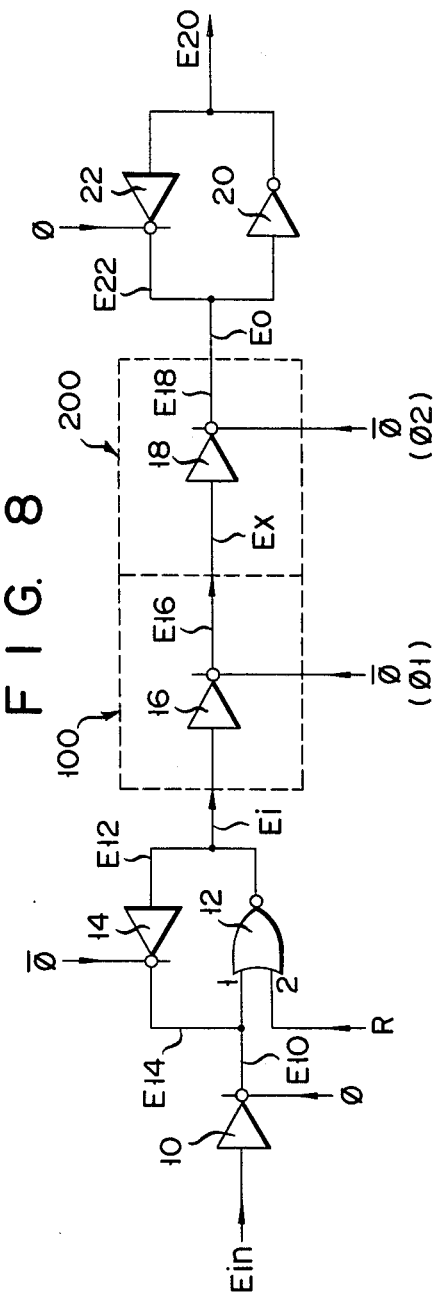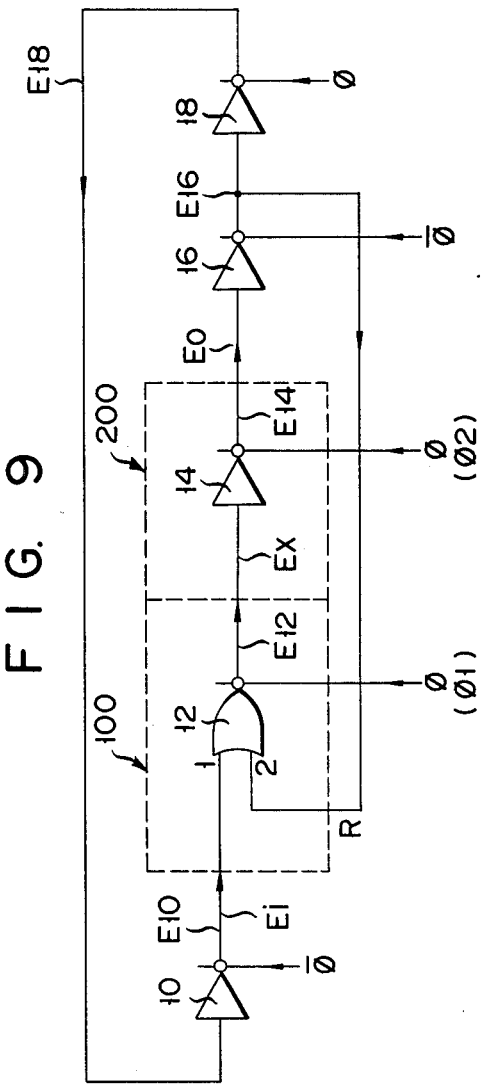

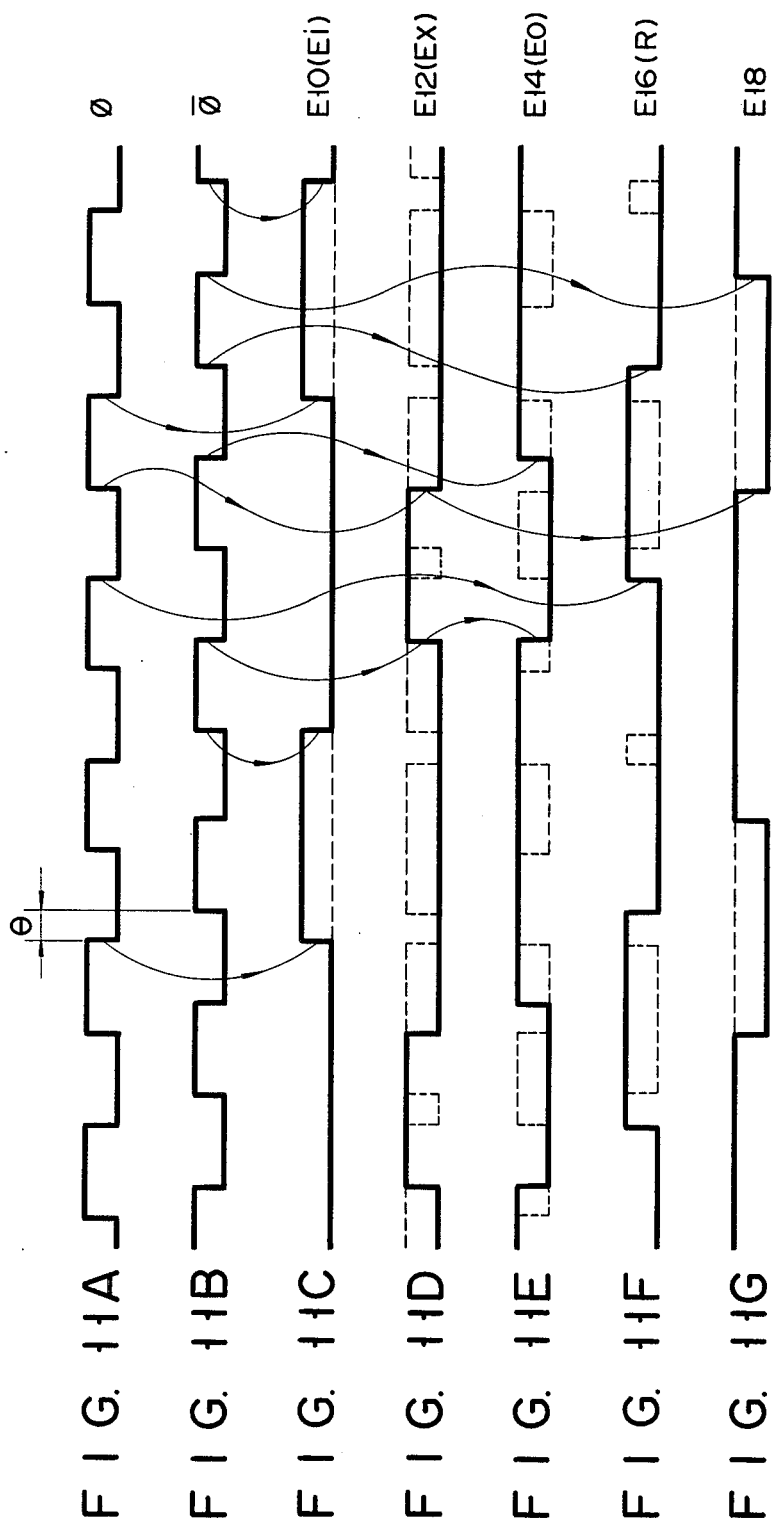

RACEFREE CMOS CLOCKED LOGIC CIRCUIT

BACKGROUND OF THE INVENTION

The present invention relates to a clocked logic circuit including a CMOS synchronous gate and, more particularly, to an improvement of a CMOS clocked logic circuit in which a clock race problem caused by an overlap of two clock phases is avoided.

In a conventional synchronous CMOS logic circuit, signals to be gated are supplied to asynchronous gate circuits in synchronism with clock signals during the signal transfer, thereby obtaining a desired logic operation. However, when an asynchronous CMOS gate circuit is used together with synchronous CMOS gate circuits in a manner that the asynchronous circuit is inserted between or provided among the synchronous circuits, a clock race problem due to the overlap of two clock phases (clock skew) occurs, resulting in erroneous operation. Such a clock race problem is chiefly caused by the slow switching speed of CMOS gates.

The "clock race problem" is a known subject to a skilled person in the art. As for the details of "clock race problem", reference should be made to the following literature:

N. F. Goncalves, et al., "A Racefree Dynamic CMOS Technique for Pipelined Logic Structures" in ESSCIRC Dig. Tech. Papers, 1982, pp. 141-144.

SUMMARY OF THE INVENTION

The present invention has been made in consideration of a clock race problem of CMOS logic circuit and has as its object to provide a CMOS clocked logic circuit which is free from erroneous operation caused by signal races when a clock skew occurs.

To achieve the above object a racefree CMOS clocked logic circuit includes a first CMOS clocked gate for selectively transferring an input signal according to a first clock pulse and providing an interstage signal which corresponds to the input signal, and a second CMOS clocked gate, coupled directly to the first CMOS clocked gate, for selectively transferring the interstage signal according to a second clock pulse and providing an output signal which corresponds to the interstage signal. The operation of the first CMOS clocked gate is synchronized to the first clock pulse, and the operation of the second CMOS clocked gate is synchronized to the second clock pulse. The second clock pulse is in-phase with the first clock pulse so that signal races between the input and output signals are eliminated. Or, the second clock pulse may be identical to the first clock pulse for avoiding the signal races.

BRIEF DESCRIPTION OF THE DRAWINGS

FIGS. 3A to 3G are timing charts explaining a racefree operation of the circuit of FIG. 2B and also explaining an operation of the circuit of FIG. 2C which suffers signal races;

FIG. 4 shows another circuit diagram (shift register) of a racefree CMOS clocked logic circuit embodying the present invention;

FIGS. 5A to 5M are timing charts explaining a racefree operation of the circuit of FIG. 4;

FIG. 6 shows still another circuit diagram (shift register) of a racefree CMOS clocked logic circuit embodying the present invention;

FIGS. 7A to 7E are timing charts explaining a racefree operation of the circuit of FIG. 6;

FIG. 8 shows yet another circuit diagram (D type flip-flop) of a racefree CMOS clocked logic circuit embodying the present invention;

FIG. 9 shows a circuit diagram of a racefree CMOS clocked ½ frequency divider embodying the present invention, which is an application of the circuit shown in FIG. 6;

FIGS. 11A to 11G show timing charts explaining the operation of the circuit shown in FIG. 10.

DETAILED DESCRIPTION OF THE PREFERRED EMBODIMENTS

An embodiment of the present invention will be described in detail with reference to the accompanying drawings.

Figure 1:
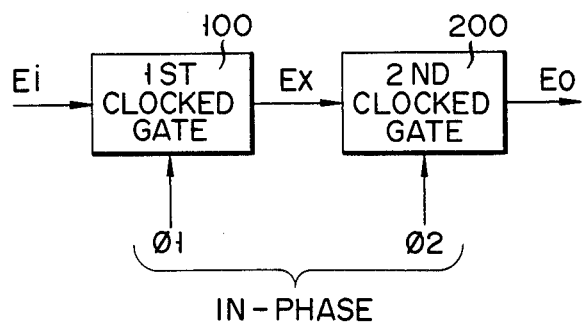
FIG. 1 shows a basic block configuration of a racefree CMOS clocked logic circuit according to the present invention.

FIG. 1 shows a basic block configuration of a racefree CMOS clocked logic circuit according to one embodiment of the present invention.

In FIG. 1 an input signal Ei and a first clock pulse $\phi 1$ are supplied to a first CMOS clocked gate 100. Clocked gate 100 selectively transfers input signal Ei according to the clocking of first clock pulse $\phi 1$ and provides an interstage signal Ex corresponding to input signal Ei. Interstage signal Ex is supplied to a second CMOS clocked gate 200. Clocked gate 200 receives a second clock pulse $\phi 2$ and selectively transfers the interstage signal Ex according to the clocking of second clock pulse $\phi 2$. Then, clocked gate 200 provides an output signal Eo corresponding to interstage signal Ex as well as to input signal Ei. The operation of first CMOS clocked gate 100 is synchronized to first clock pulse $\phi 1$, and the operation of second CMOS clocked gate 200 is synchronized to second clock pulse $\phi 2$. Second clock pulse $\phi 2$ is in-phase with first clock pulse $\phi 1$ so that signal races between input signal Ei and output signal Eo are eliminated. In general, second clock pulse $\phi 2$ is identical to first clock pulse $\phi 1$. The detailed configuration for avoiding the clock race problem (signal races) will be described later.

Figure 2A:
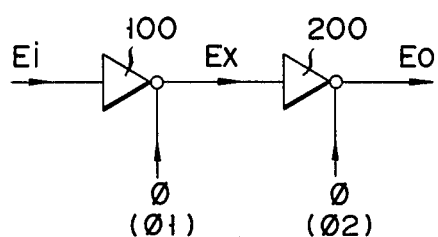
FIG. 2A shows a simple logic circuit embodying the configuration of FIG. 1.

FIG. 2A shows a simple logic circuit embodying the configuration of FIG. 1. First and second clocked gates 100 and 200 of FIG. 1 correspond to clocked inverters 100 and 200 of FIG. 2A, respectively. Clocked inverter 100 transfers input signal Ei according to a clock pulse $\phi$ ($\phi 1$) and provides interstage signal Ex. Clocked inverter 200 transfers interstage signal Ex according to clock pulse $\phi$ ($\phi 2$) and provides output signal Eo. In the embodiment of FIG. 2A, inverters 100 and 200 are clocked by the same clock pulse $\phi$, thereby eliminating signal races.

Figure 2B:
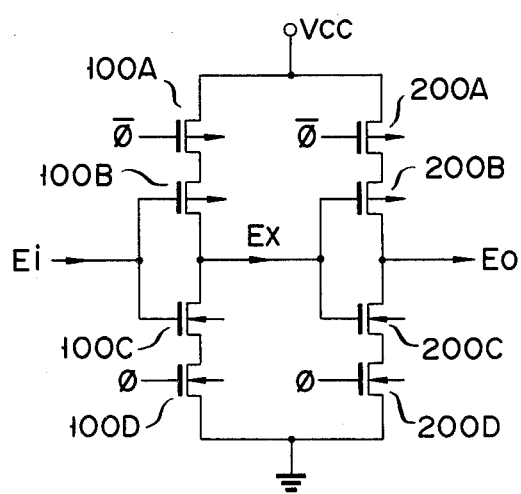
FIG. 2B shows details of the circuit of FIG. 2A.

FIG. 2B shows details of the circuit of FIG. 2A. Clocked inverter 100 of FIG. 2A corresponds to a CMOS circuit being formed of MOSFETs 100A to 100D, and clocked inverter 200 of FIG. 2A corresponds to a CMOS circuit being formed of MOSFETs 200A to 200D. Although CMOS inverter (100A–100D) is clocked by a pair of noninverted and inverted clock pulses φ and $\overline{\phi}$, the clock pulse of this inverter is represented by the noninverted clock pulse φ. Similarly, the clock pulse of CMOS inverter (200A-200D) is represented by the noninverted clock pulse φ.

Figure 2C:
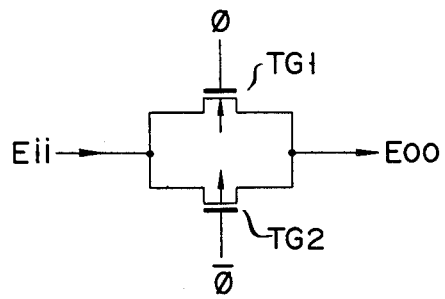
FIG. 2C shows a conventional transfer gate whose logic operation is functionally equivalent to the logic operation of the circuit of FIG. 2B.

FIG. 2C shows a conventional transfer gate having a logic operation being functionally equivalent to the logic operation of the circuit of FIG. 2B. An input signal Eii is transferred through a MOSFET gate TG1 according to a noninverted clock pulse φ and becomes an output signal Eoo. Input signal Eii is also transferred through a MOSFET gate TG2 according to an inverted clock pulse $\overline{\phi}$ and becomes output signal Eoo.

FIGS. 3A to 3G are timing charts explaining a race-free operation of the circuit of FIG. 2B and also explaining an operation of the circuit of FIG. 2C which will suffer signal races.

First, explanation will be given to the operation of the circuitry of FIG. 2B. When φ=1, $\overline{\phi}$=0 and Ei=0 (time t30 in FIGS. 3A-3E); FET 100A=ON, FET 100B=ON, FET 100C=OFF and FET 100D=ON, resulting in Ex=1. Then, FET 200A=ON, FET 200B=OFF, FET 200C=ON and FET 200D=ON. Accordingly, Eo=0.

When φ is changed from 1 to 0 under the condition that $\overline{\phi}$=0 and Ei=0 (time t31); FET 100A=ON, FET 100B=ON, FET 100C=OFF and FET 100D is changed from ON to OFF, resulting in also Ex=1. Then, FET 200A=ON, FET 200B=OFF, FET 200C=ON and FET 200D is changed from ON to OFF. In this case, since the output node of inverter (200A-200D) is open-circuited by the OFF of FETs 200B and 200D, the preceding logical state Eo=0 is retained.

When Ei is changed from 0 to 1 under the condition that φ=0 and $\overline{\phi}$=0 (time t32); FET 100A=ON, FET 100B is changed from ON to OFF, FET 100C is changed from OFF to ON and FET 100D=OFF, resulting in retaining Ex=1 since the output node of inverter (100A-100D) is open-circuited by the OFF of FETs 100B and 100D. Then, FET 200A=ON, FET 200B=OFF, FET 200C=ON and FET 200D=OFF. In this case, since the output node of inverter (200A-200D) is open-circuited by the OFF of FETs 200B and 200D, the logical state Eo=0 is retained also.

When φ is changed from 0 to 1 under the condition that φ=0 and Ei=1 (time t33); FET 100A is changed from ON to OFF, FET 100B=OFF, FET 100C=ON and FET 100D=OFF, resulting in retaining Ex=1 since the output npde of inverter (100A-100D) is open-circuited by the OFF of FETs 100B and 100D. Then, FET 200A is changed from ON to OFF, FET 200B=OFF, FET 200C=ON and FET 200D=OFF. In this case, since the output node of inverter (200A-200D) is open-circuited by the OFF of FETs 200B and 200D, the logical state Eo=0 is retained.

When φ is changed from 0 to 1 under the condition that φ=1 and Ei=1 (time t34); FET 100A=OFF, FET 100B=OFF, FET 100C=ON and FET 100D is changed from OFF to ON, resulting in the level change from 1 to 0 of Ex. Then, FET 200A=OFF, FET 200B is changed from OFF to ON, FET 200C is changed from ON to OFF and FET 200D is changed from OFF to ON. In this case, since the output node of inverter (200A-200D) is open-circuited by the OFF of FETs 200A and 200C, the logical state Eo=0 is retained.

When φ is changed from 1 to 0 under the condition that $\overline{\phi}$=1 and Ei=1 (time t35); FET 100A is changed from OFF to ON, FET 100B=OFF, FET 100C=ON and FET 100D=ON. Accordingly, Ex=0. Then, FET 200A is changed from OFF to ON, FET 200B=ON, FET 200C=OFF and FET 200D=ON, resulting in the level change from 0 to 1 of Eo.

When φ is changed from 1 to 0 under the condition that $\overline{\phi}$=0 and Ei=1 (time t36); FET 100A=ON, FET 100B=OFF, FET 100C=ON and FET 100D is changed from ON to OFF, resulting in retaining Ex=0 since the output node of inverter (100A-100D) is open-circuited by the OFF of FETs 100B and 100D. Then, FET 200A=ON, FET 200B=ON, FET 200C=OFF and FET 200D is changed from ON to OFF. Accordingly, Eo=1.

When Ei is changed from 1 to 0 under the condition that φ=0 and $\overline{\phi}$=0 (time t37); FET 100A=ON, FET 100B is changed from OFF to ON, FET 100C is changed from ON to OFF and FET 100D=OFF, resulting in the level change from 0 to 1 of Ex. Then, FET 200A=ON, FET 200B is changed from ON to OFF, FET 200C is changed from OFF to ON and FET 200D=OFF. In this case, since the output node of inverter (200A-200D) is open-circuited by the OFF of FETs 200B and 200D, the logical state Eo=1 is retained.

When $\overline{\phi}$ is changed from 0 to 1 under the condition that φ=0 and Ei=0 (time t38); FET 100A is changed from ON to OFF, FET 100B=ON, FET 100C=OFF and FET 100D=OFF, resulting in retaining Ex=1 since the output node of inverter (100A-100D) is open-circuited by the OFF of FETs 100A, 100C and 100D. Then, FET 200A is changed from ON to OFF, FET 200B=OFF, FET 200C=ON and FET 200D=OFF. In this case, since the output node of inverter (200A-200D) is open-circuited by the OFF of FETs 200A and 200D, the logical state Eo=1 is retained.

When φ is changed from 0 to 1 under the condition that $\overline{\phi}$=1 and Ei=0 (time t39); FET 100A=OFF, FET 100B=ON, FET 100C=OFF and FET 100D is changed from OFF to ON, resulting in retaining Ex=1 since the output node of inverter (100A-100D) is open-circuited by the OFF of FETs 100A and 100C. Then, FET 200A=OFF, FET 200B=OFF, FET 200C=ON and FET 200D is changed from OFF to ON, resulting in the level change from 1 to 0 of Eo.

As is apparent from the above explanation and the illustration of FIGS. 3A-3E, even if the level change of input signal Ei appears within the clock skew period (t31-t33 or t36-t38), the leading edge of output signal Eo is exactly determined by the falling of inverted clock pulse $\overline{\phi}$ (t35) and the trailing edge thereof is exactly determined by the rising of noninverted clock pulse φ (t39), and ouput signal Eo always has a fixed phase delay of half period of clock pulses from the preceding appearance of clock pulse φ. Thus, no signal races occur.

Now, explanation will be given to the operation of the conventional circuitry of FIG. 2C. When φ=1, $\overline{\phi}$=0 and Eii=0 (time t30 in FIGS. 3A, 3B, 3F and 3G); FET TG1=ON and FET TG2=ON, resulting in Eoo=0.

When Eii is changed from 0 to 1 under the condition that φ=0 and $\overline{\phi}$=0 (time t32); FET TG1=OFF and FET TG2=ON, resulting in the level change from 0 to 1 of Eoo. This level change of Eoo occurs independently of the change of clock pulses φ and $\overline{\phi}$.

When $\overline{\phi}$ is changed from 0 to 1 under the condition that φ=0 and Eii=1 (time t33); TG1=OFF and TG2 is changed from ON to OFF, resulting in retaining the preceding state of Eoo=1 since FETs TG1 and TG2 are both OFF.

When $\phi$ is changed from 0 to 1 under the condition that $\phi=1$ and Eii=1 (time t34); TG1 is changed from OFF to ON and TG2=OFF, resulting in Eoo=1.

When $\phi$ is changed from 1 to 0 under the condition that $\phi=1$ and Eii=1 (time t35); TG1=ON and TG2 is changed from OFF to ON, resulting in Eoo=1.

When $\phi$ is changed from 1 to 0 under the condition that $\overline{\phi}=0$ and Eii=1 (time t36); TG1 is changed from ON to OFF and TG2=ON, resulting in Eoo=1.

When Eii is changed from 1 to 0 under the condition that $\phi=0$ and $\overline{\phi}=0$ (time t37); FET TG1=OFF and FET TG2=ON, resulting in the level change from 1 to 0 of Eoo. This level change of Eoo occurs independently of the change of clock pulses $\phi$ and $\overline{\phi}$.

As is apparent from the above explanation and the illustration of FIGS. 3A, 3B, 3F and 3G, the leading and trailing edges of output signal Eoo are not determined by the rising nor falling of clock pulses $\phi$ and $\overline{\phi}$ (t32, t37). Accordingly, the timing of generation of output signal Eoo cannot be controlled by the clock pulses $\phi$ and $\overline{\phi}$, if a clock skew $\theta$ (FIGS. 3A and 3B) occurs and input signal Eii changes its level during the period of this clock skew $\theta$. Thus, signal races will occur.

FIG. 4 shows a shift register which is another embodiment of the racefree CMOS clocked logic circuit shown in FIG. 1.

In FIG. 4 an input signal Ein is supplied to a clocked inverter 10 which is clocked by an inverted clock $\overline{\phi}$. An output signal E10 from inverter 10 is supplied to the first input of a NOR gate 12 whose second input receives a signal R. An output signal E12 (Ei) from NOR gate 12 is supplied to a clocked inverter 14 which is clocked by a noninverted clock $\phi$ ($\phi$1). An output signal E14 (Ex) from inverter 14 is supplied to a clocked inverter 16. Inverter 16 provides an output signal E16 (Eo) according to noninverted clock $\phi$ (=$\phi$2 which is in-phase with or identical to clock $\phi$1), thereby avoiding signal races.

FIGS. 5A to 5M are timing charts illustrating a racefree operation of the circuit of FIG. 4. In FIGS. 5A–5G, the level of signal R is fixed at 0 and, in FIGS. 5H–5M, the level of signal E10 is fixed at 0. The racefree operation of clocked inverters 14 and 16 shown in FIG. 4 is substantially the same as in the case of FIGS. 2A or 2B. Accordingly, detailed explanation of the circuit operation of FIG. 4 is omitted here, but the circuit operation would easily be understood from the illustration of FIGS. 5A–5M. According to the configuration of FIG. 4, although signal races from signal Ein to signal Ex could happen, signal races from signal Ein to signal Eo are eliminated by the operation of directly-coupled series circuit of clocked gates 100 and 200 in which clock $\phi$1 is in-phase with or identical to clock $\phi$2.

FIG. 6 shows a shift register which is a modification of the racefree CMOS shift register of FIG. 4.

In FIG. 6 an input signal Ein is supplied to a clocked inverter 10 which is clocked by an inverted clock $\overline{\phi}$. An output signal E10 (Ei) from inverter 10 is supplied to the first input of a clocked NOR gate 12 whose second input receives a signal R. NOR gate 12 provides an output signal E12 (Ex) according to a noninverted clock $\phi$1 which is antiphasic to inverted clock $\overline{\phi}$. Output signal E12 from NOR gate 12 is supplied to a clocked inverter 14. Inverter 14 is clocked by a noninverted clock $\phi$2 which is in-phase with or identical to clock $\phi$1. An output signal E14 (Eo) from inverter 14 is supplied to a clocked inverter 16. Inverter 16 provides an output signal E16 according to inverted clock $\overline{\phi}$. According to the configuration of FIG. 6, signal races from signal Ei or R to signal Eo are eliminated by the configuration in which clocked NOR gate 12 is directly coupled in series to clocked inverter 14 and clock $\phi$1 is in-phase with or identical to clock $\phi$2.

FIGS. 7A to 7E are timing charts illustrating a racefree operation of the circuit of FIG. 6. When consideration is given to a case where signal E10 is fixed at logical 0, the racefree operation of clocked NOR gate 12 and clocked inverter 14 shown in FIG. 6 is substantially the same as in the case of FIGS. 2A or 2B. Accordingly, detailed explanation of the circuit operation of FIG. 6 is omitted here, but the circuit operation would easily be understood from the illustration of FIGS. 7A–7E. According to the configuration of FIG. 6, no signal races occur by the operation of a directly-coupled series circuit of clocked gates 100 and 200 in which clock $\phi$1 is in-phase with or identical to clock $\phi$2.

FIG. 8 shows a D type flip-flop which is another embodiment of the racefree CMOS clocked logic circuit shown in FIG. 1.

In FIG. 8 an input signal Ein (D input) is supplied to a clocked inverter 10 which is clocked by a noninverted clock $\phi$. An output signal E10 from inverter 10 is supplied to the first input of a NOR gate 12 whose second input receives a reset signal R. An output signal E12 (Ei) from NOR gate 12 is supplied to a clocked inverter 14. Inverter 14 is clocked by an inverted clock $\overline{\phi}$ which is antiphasic to clock $\phi$. An output signal E14 from inverter 14 is fed back to the first input of NOR gate 12. Output signal E12 from NOR gate 12 is supplied to a clocked inverter 16. Inverter 16 is clocked by inverted clock $\overline{\phi}$ ($\phi$1). An output signal E16 (Ex) from inverter 16 is supplied to a clocked inverter 18. Inverter 18 outputs a signal E18 (Eo) according to inverted clock $\overline{\phi}$ ($\phi$2). Output signal E18 from inverter 18 is supplied to an inverter 20. An output signal E20 from inverter 20 is supplied to a clocked inverter 22. Inverter 22 is clocked by noninverted clock $\phi$. An output signal E22 from inverter 22 is fed back to the input of inverter 20.

According to the configuration of FIG. 8, signal races from E12 (Ei) to E18 (Eo) are eliminated by the configuration in which clocked inverters 16 and 18 are directly connected in series and clock $\phi$1 is in-phase with or identical to clock $\phi$2. The racefree operation of FIG. 8 with respect to clocked inverters 16 and 18 is substantially the same as in the case of FIG. 2A.

FIG. 9 shows a ½ frequency divider which is one embodiment of the racefree CMOS clocked logic circuit shown in FIG. 1.

A signal E18 is supplied to a clocked inverter 10 which is clocked by an inverted clock $\overline{\phi}$. A signal E10 (Ei) from inverter 10 is supplied to a first input of a clocked NOR gate 12. NOR gate 12 is clocked by a noninverted clock $\phi$ ($\phi$1) which is antiphasic to the inverted clock $\overline{\phi}$. A signal E12 (Ex) from NOR gate 12 is supplied to a clocked inverter 14 which is clocked by noninverted clock $\phi$ ($\phi$2). A signal E14 (Eo) from inverter 14 is supplied to a clocked inverter 16. Inverter 16 is clocked by inverted clock $\overline{\phi}$ and provides a signal E16 (R). Signal E16 is supplied to a second input of NOR gate 12 and to a clocked inverter 18. Inverter 18 is clocked by noninverted clock $\phi$ and outputs the signal E18. Signal E18 is fed back to inverter 10. Clocked NOR gate 12 may be the first clocked gate 100 and clocked inverter 14 may be the second clocked gate 200.

In FIG. 9, noninverted clock $\phi$ ($\phi$1) of gate 12 is in-phase with or identical to noninverted clock $\phi$ ($\phi$2) of inverter 14, thereby eliminating signal races from signal E10 (or E16) to signal E14. The racefree operation of elements 12 and 14 is substantially the same as that of elements 12 and 14 in FIG. 6.

Figure 10:
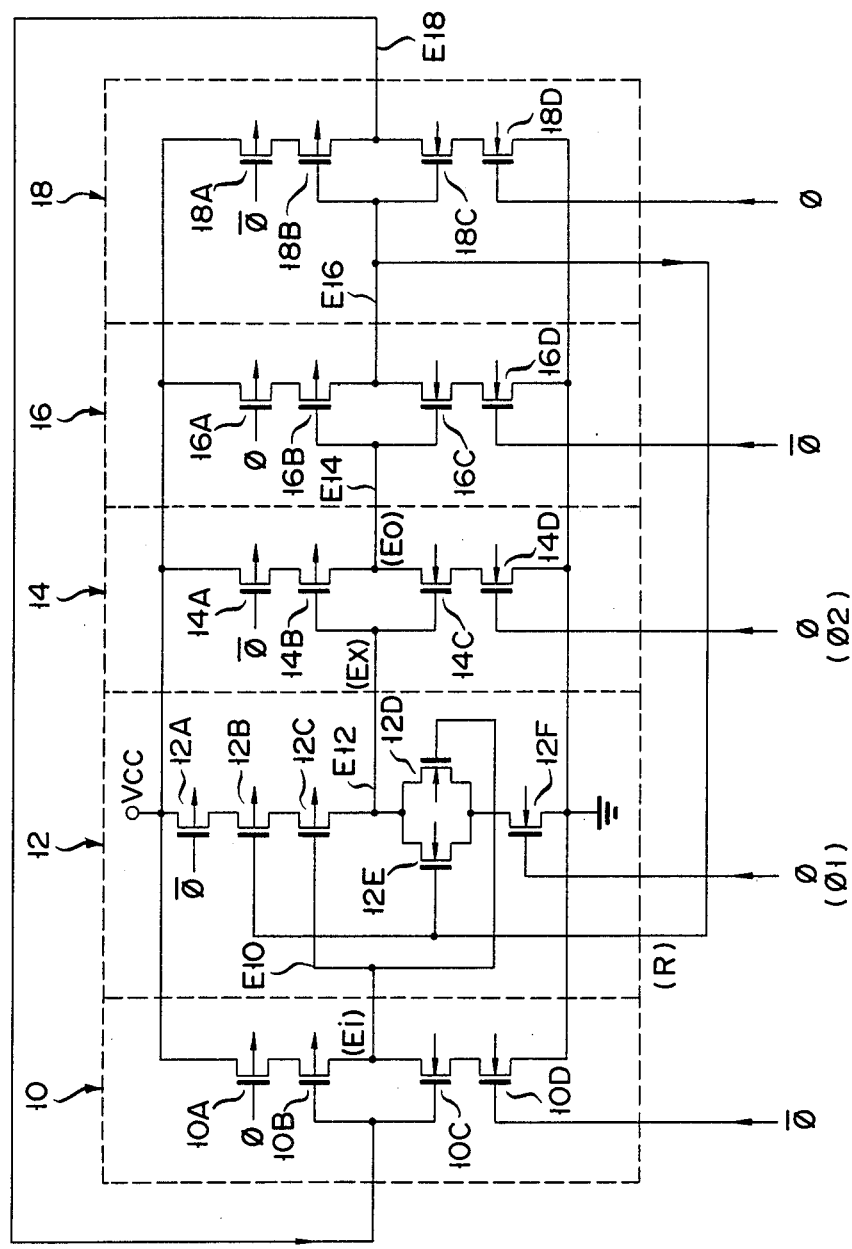
FIG. 10 shows details of a racefree CMOS clocked ½ frequency divider of the circuit shown in FIG. 9.

FIG. 10 shows details of the circuit of FIG. 9.

The source of a P-channel MOS transistor 10A is connected to a positive power line Vcc. The gate of transistor 10A receives a noninverted clock $\phi$ and the drain thereof is connected to the source of a P-channel MOS transistor 10B. The gate and drain of transistor 10B are respectively connected to the gate and drain of an N-channel MOS transistor 10C. The source of transistor 10C is connected to the drain of an N-channel MOS transistor 10D. The gate of transistor 10D receives an inverted clock $\bar{\phi}$ and the source thereof is connected to a circuit ground line. The gate of each of transistors 10B and 10C receives a signal E18, and the drains of these transistors output a signal E10 (Ei). Transistors 10A–10D constitute the clocked inverter 10 of FIG. 9. The inverted clock $\bar{\phi}$ supplied to inverter 10 of FIG. 9 corresponds to the inverted clock $\bar{\phi}$ supplied to transistor 10D.

Signal E10 from transistors 10B and 10C is supplied to the gate of a P-channel MOS transistor 12C. The source of transistor 12C is connected to the drain of a P-channel MOS transistor 12B. The gate of transistor 12B receives a signal E16, and the source thereof is connected to the drain of a P-channel MOS transistor 12A. The gate of transistor 12A receives inverted clock $\bar{\phi}$, and the source thereof is connected to power line Vcc. The drain of transistor 12C is connected to the drain of each of N-channel MOS transistors 12D and 12E. The drains of transistors 12C–12E output a signal E12 (Ex). The gate of transistor 12D receives signal E10, and the gate of transistor 12E receives signal E16. The source of each of transistors 12D and 12E is connected to the drain of an N-channel MOS transistor 12F. The gate of transistor 12F receives noninverted clock $\phi$ ($\phi$1), and the source thereof is grounded. Transistors 12A–12F constitute the clocked NOR gate 12 of FIG. 9. The noninverted clock $\phi$ supplied to NOR gate 12 of FIG. 9 corresponds to the noninverted clock $\phi$ supplied to transistor 12F.

Signal E12 from transistors 12C–12E is supplied to the gate of a P-channel MOS transistor 14B. The source of transistor 14B is connected to the drain of a P-channel MOS transistor 14A. The gate of transistor 14A receives inverted clock $\bar{\phi}$, and the source thereof is connected to power line Vcc. The drain of transistor 14B is connected to the drain of N-channel MOS transistor 14C. The drains of transistors 14B and 14C output a signal E14 (Eo). The gate of transistor 14C receives signal E12. The source of transistor 14C is connected to the drain of an N-channel MOS transistor 14D. The gate of transistor 14D receives noninverted clock $\phi$ ($\phi$2), and the source thereof is grounded. Transistors 14A–14D constitute the clocked inverter 14 of FIG. 9. The noninverted clock $\phi$ supplied to inverter 14 of FIG. 9 corresponds to the noninverted clock $\phi$ supplied to transistor 14D.

Signal E14 from transistors 14B and 14C is supplied to the gate of a P-channel MOS transistor 16B. The source of transistor 16B is connected to the drain of a P-channel MOS transistor 16A. The gate of transistor 16A receives noninverted clock $\phi$, and the source thereof is connected to power line Vcc. The drain of transistor 16B is connected to the drain of N-channel MOS transistor 16C. The drains of transistors 16B and 16C output the signal E16 (R). The gate of transistor 16C receives signal E14. The source of transistor 16C is connected to the drain of an N-channel MOS transistor 16D. The gate of transistor 16D receives inverted clock $\bar{\phi}$, and the source thereof is grounded. Transistors 16A–16D constitute the clocked inverter 16 of FIG. 9. The inverted clock $\bar{\phi}$ supplied to inverter 16 of FIG. 9 corresponds to the inverted clock $\bar{\phi}$ supplied to transistor 16D.

Signal E16 from transistors 16B and 16C is supplied to the gate of a P-channel MOS transistor 18B. The source of transistor 18B is connected to the drain of a P-channel MOS transistor 18A. The gate of transistor 18A receives inverted clock $\bar{\phi}$, and the source thereof is connected to power line Vcc. The drain of transistor 18B is connected to the drain of N-channel MOS transistor 18C. The drains of transistors 18B and 18C output the signal E18. The gate of transistor 18C receives signal E16. The source of transistor 18C is connected to the drain of an N-channel MOS transistor 18D. The gate of transistor 18D receives noninverted clock $\phi$, and the source thereof is grounded. Transistors 18A–18D constitute the clocked inverter 18 of FIG. 9. The noninverted clock $\phi$ supplied to inverter 18 of FIG. 9 corresponds to the noninverted clock $\phi$ supplied to transistor 18D.

FIGS. 11A–11G show timing charts illustrating the operation of the circuit shown in FIG. 10. In FIGS. 11A and 11B, a clock skew or phase deviation $\theta$ between noninverted clock $\phi$ and inverted clock $\bar{\phi}$ occurs. Such a clock skew $\theta$ provides the overlap of two clock phases of $\phi$ and $\bar{\phi}$ and, if NOR gate 12 is an asynchronous type (as in a case of conventional circuitry), clock skew $\theta$ causes signal races as shown by the dashed lines in FIGS. 11C–11G. If you wish to know detailed mechanism of the generation of signal races, reference should be made to the aforementioned N. F. Goncalves literature. The racefree operation of clocked gate 12 and clocked inverter 14 shown in FIGS. 9 or 10 is substantially the same as in the case of FIG. 6. Accordingly, detailed explanation of the circuit operation of FIG. 10 is omitted here, but the circuit operation would be understood from the illustration of FIGS. 11A–11G.

In the configuration of FIGS. 9 or 10, no signal races occur because of the operation of directly-coupled series circuit of clocked gates 100 (12) and 200 (14) in which clock $\phi$1 is in-phase with or identical to clock $\phi$2.

As mentioned above, according to the embodiment of the present invention, no operational error due to signal races, which will be caused by the clock skew $\theta$, occurs. This advantage is obtained from the generic configuration as shown in FIG. 1.

The present invention is not limited to the particular embodiment described above. Various changes and modifications may be made within the scope of the claimed invention. The present invention may be applied to a general CMOS circuit having two or more series-connected clocked logic circuits.

What is claimed is:

1. A racefree CMOS clocked logic circuit comprising: first clocked circuit means including means for providing an input signal and being responsive to said input signal and to a first clock pulse, for selectively transferring said input signal according to said first clock pulse, to provide an interstage signal corresponding to said input signal, said first clocked circuit means including:

a first CMOS clocked gate responsive to said input signal and being clocked by a clock pulse corresponding to said first clock pulse for providing said interstage signal, a second CMOS clocked gate being responsive to a first signal and to an inverted clock pulse, said inverted clock pulse being antiphasic to said first clock pulse for selectively and phase-invertedly transferring said first signal according to said inverted clock pulse to provide a second signal, a CMOS logic gate coupled to said second CMOS clocked gate for selectively transferring said second signal to provide said input signal; and second clocked circuit means coupled to said first clocked circuit means and being responsive to said interstage signal and to a second clock pulse for selectively transferring said interstage signal according to said second clock pulse to provide an output signal corresponding to said interstage signal, said second clock pulse being in-phase with said first clock pulse, said second clocked circuit means including:

a third CMOS clocked gate responsive to said interstage signal and being clocked by a clock pulse corresponding to said second clock pulse for providing said output signal.

2. A clocked logic circuit according to claim 1, wherein said first, second and third CMOS clocked gates are inverters.

3. A clocked logic circuit according to claim 1, wherein said first CMOS clocked gate comprises:

a first MOSFET of a first semiconductor type having a source coupled to a positive power source, a gate responsive to an inverted clock pulse which is antiphasic to said first clock pulse and a drain;

a second MOSFET of a first semiconductor type having a source coupled to the drain of said first MOSFET, a gate responsive to said input signal and a drain for generating said interstage signal;

a third MOSFET of a second semiconductor type having a drain coupled to the drain of said second MOSFET, a gate responsive to said input signal and a source;

a fourth MOSFET of a second semiconductor type having a drain coupled to the source of said third MOSFET, a gate responsive to said clock pulse and a source coupled to a negative power source, and wherein said third CMOS clocked gate comprises:

a fifth MOSFET of a first semiconductor type having a source coupled to said positive power source, a gate responsive to said inverted clock pulse and a drain;

a sixth MOSFET of a first semiconductor type having a source coupled to the drain of said fifth MOSFET, a gate responsive to said interstage signal and a drain for generating said output signal;

a seventh MOSFET of a second semiconductor type having a drain coupled to the drain of said sixth MOSFET, a gate responsive to said interstage signal and a source;

an eighth MOSFET of a second semiconductor type having a drain coupled to the source of said seventh MOSFET, a gate responsive to said clock pulse and a source coupled to said negative power source.

4. A racefree CMOS clocked logic circuit comprising: first clocked circuit means including means for providing an input signal and being responsive to said input signal and to a first clock pulse, for selectively transferring said input signal according to said first clock pulse, to provide an interstage signal corresponding to said input signal, said first clocked circuit means including:

a first CMOS clocked gate responsive to said input signal and being clocked by a clock pulse corresponding to said first clock pulse for providing said interstage signal, a second CMOS clocked logic gate being responsive to a first signal and an inverted clock pulse, said inverted clock pulse being antiphasic to said first clock pulse for selectively transferring said first signal according to said inverted clock pulse to provide said input signal; and second clocked circuit means coupled to said first clocked circuit means and being responsive to said interstage signal and to a second clock pulse for selectively transferring said interstage signal according to said second clock pulse to provide an output signal corresponding to said interstage signal and a further second signal, said second clock pulse being in-phase with said first clock pulse, said second clocked circuit means including:

a third CMOS gate responsive to said interstage signal and being clocked by a clock pulse corresponding to said second clock pulse and providing said output signal, a fourth CMOS clocked gate responsive to said output signal and to said inverted clock pulse for selectively transferring said output signal according to said inverted clock pulse to provide said second signal.

5. A racefree CMOS clocked logic circuit comprising: first clocked circuit means including means for providing an input signal and being responsive to said input signal and to a first clock pulse, for selectively transferring said input signal according to said first clock pulse to provide an interstage signal corresponding to said input signal, said first clocked circuit means including:

a first CMOS clocked gate responsive to said input signal and being clocked by an inverted clock pulse corresponding to said first clock pulse for providing said interstage signal, a second CMOS clocked gate being responsive to a first signal and a noninverted clocked pulse, said noninverted clock pulse being antiphasic to said inverted clock pulse for selectively transferring said first signal according to said noninverted clock pulse to provide a second signal, a first CMOS nonclocked logic gate having an input terminal coupled to said second CMOS clocked gate for transferring said second signal to provide said input signal, a third CMOS clocked gate coupled to said first CMOS nonclocked logic gate and being responsive to said input signal and to said inverted clock pulse for selectively transferring said input signal according to said inverted clock pulse to provide a third signal which is fed back to the input terminal of said first CMOS nonclocked logic gate; and second clocked circuit means coupled to said first clocked circuit means and being responsive to said interstage signal and to a second clock pulse for selectively transferring said interstage signal according to said second clock pulse to provide an output signal corresponding to said interstage signal and a further fourth signal, said second clock pulse being in-phase with said first clock pulse, said second clocked circuit means including:
- a fourth CMOS clocked gate responsive to said interstage signal and being clocked by an inverted clock pulse corresponding to said second clock pulse and providing said output signal,
- a second CMOS nonclocked gate having an input terminal being coupled to said fourth CMOS clocked gate for transferring said output signal to provide said fourth signal,
- a fifth CMOS clocked gate being coupled to said second CMOS nonclocked gate and being responsive to said fourth signal and to said noninverted clock pulse for selectively transferring said fourth signal according to said noninverted clock pulse to provide a fifth signal which is fed back to the input terminal of said second CMOS nonclocked gate, whereby the combination of said first, second, third, fourth and fifth CMOS clocked gates and said first and second CMOS nonclocked gates constitute a racefree D-type flipflop.

6. A racefree CMOS clocked logic circuit comprising: first clocked circuit means including means for providing an input signal and being responsive to said input signal and to a first clock pulse, for selectively transferring said input signal according to said first clock pulse to provide an interstage signal corresponding to said input signal, said first clocked circuit means including:
- a CMOS clocked NOR gate having a first input terminal responsive to said input signal and a second input terminal responsive to a first feedback signal, for providing said interstage signal according to the logical NOR of said input and first feedback signals, said CMOS clocked NOR gate being clocked by a clock pulse corresponding to said first clock pulse,
- a first CMOS clocked inverter responsive to a second feedback signal and an inverted clock pulse, said inverted clock pulse being antiphasic to said first clock pulse for selectively and phase-invertedly transferring said second feedback signal according to said inverted clock pulse to provide said input signal; and second clocked circuit means coupled to said first clocked circuit means and being responsive to said interstage signal and to a second clock pulse to provide an output signal corresponding to said interstage signal and said first and second feedback signals, said second clock pulse being in-phase with said first clock pulse, said second clocked circuit means including:
- a second CMOS clocked inverter coupled to said CMOS clocked NOR gate, for selectively transferring said interstage signal to provide said output signal, said second CMOS clocked inverter clocked by a clock pulse corresponding to said second clock pulse,
- a third CMOS clocked inverter responsive to said output signal and said inverted clock pulse, for selectively and phase-invertedly transferring said output signal according to said inverted clock pulse to provide said first feedback signal,
- a fourth CMOS clocked inverter responsive to said first feedback signal and said noninverted clock pulse, for selectively and phase-invertedly transferring said first feedback signal according to said noninverted clock pulse to provide said second feedback signal, whereby the combination of said first, second, third and fourth CMOS clocked inverters and said CMOS clocked NOR gate constitute a racefree frequency divider.

* * * * *